United States Patent [19]

Shannon et al.

[11] Patent Number: 4,646,115

[45] Date of Patent: Feb. 24, 1987

[54] SEMICONDUCTOR DEVICES HAVING FIELD-RELIEF REGIONS

[75] Inventors: John M. Shannon, Whyteleafe; John A. G. Slatter, Crawley; David J. Coe, East Grinstead, all of England

[73] Assignee: U.S. Philips Corporation, New York, N.Y.

[21] Appl. No.: 859,852

[22] Filed: May 1, 1986

Related U.S. Application Data

[63] Continuation of Ser. No. 672,022, Nov. 16, 1984, abandoned.

[30] Foreign Application Priority Data

Dec. 20, 1983 [GB] United Kingdom ............... 8333818

[51] Int. Cl.$^4$ ................................. H01L 29/80
[52] U.S. Cl. .................................. 357/15; 357/22; 357/16; 357/55; 357/54; 357/90; 357/53
[58] Field of Search .............. 357/15 M, 15 P, 16, 357/22, 54 N, 54 M, 54 A, 49, 53, 90, 55

[56] References Cited

U.S. PATENT DOCUMENTS

| | | | |
|---|---|---|---|
| 3,581,151 | 5/1971 | Boyle et al. ........................... | 357/15 |
| 3,737,701 | 6/1975 | Hoeberechts et al. ............ | 357/15 X |
| 3,924,320 | 12/1975 | Altman et al. ..................... | 357/15 X |
| 4,149,174 | 4/1979 | Shannon ............................. | 357/15 X |
| 4,288,800 | 9/1981 | Yoshida et al. .................... | 357/55 X |
| 4,338,618 | 7/1982 | Nishizawa ........................ | 357/55 X |
| 4,521,795 | 6/1985 | Coe et al. .......................... | 357/15 X |

FOREIGN PATENT DOCUMENTS

| | | | |
|---|---|---|---|
| 2511487 | 9/1975 | Fed. Rep. of Germany ........ | 357/22 |
| 52-24465 | 2/1977 | Japan ................................. | 357/15 M |
| 53-29679 | 3/1978 | Japan ................................. | 357/22 G |
| 1208574 | 10/1970 | United Kingdom ................. | 357/49 |

*Primary Examiner*—William D. Larkins
*Assistant Examiner*—William A. Mintel
*Attorney, Agent, or Firm*—Robert T. Mayer; Steven R. Biren

[57] ABSTRACT

Separate areas of an active unipolar barrier, e.g. a Schottky barrier, of a semiconductor device are located between closely-spaced field-relief regions which provide the device with an improved voltage blocking characteristic. The flow of minority carriers into the adjacent body portion under forward bias is restricted by providing, at least at the areas of the field-relief regions, a layer of different material from that of the body portion and from that of the unipolar barrier-forming means. The layer of different material may form a high-impedance electrical connection with the field-relief regions, and/or it may form with the body portion a heterojunction such as, for example, a Schottky barrier of higher barrier height, a barrier between different band gap materials or a MIS structure, which heterojunction forms part of the field-relief regions.

12 Claims, 6 Drawing Figures

SEMICONDUCTOR DEVICES HAVING FIELD-RELIEF REGIONS

This is a continuation of application Ser. No. 672,022, filed Nov. 16, 1984, now abandoned.

BACKGROUND OF THE INVENTION

This invention relates to semiconductor devices including unipolar barrier-forming means and having an improved voltage blocking characteristic, particularly but not exclusively Schottky diodes designed for blocking voltages of at least 50 volts.

Schottky diodes with high breakdown voltages are described in the article of that title by B. M. Wilamowski in Solid State Electronics, Vol. 26, (1983), No. 5, pages 491 to 493. The disclosed device comprises a semiconductor body a portion of which is of one conducting type, unipolar barrier-forming means which form an active barrier with said body portion at a plurality of separate areas, and closely-spaced field-relief regions which protrude to a depth in the body below the active barrier. The separate areas of the active barrier are located between the closely-spaced field-relief regions. The device has an improved voltage blocking characteristic due to the field-relief regions being sufficiently closely spaced that depletion layers extending in the body portion from neighboring field-relief regions merge together under reverse-bias of the active barrier. The unipolar barrier-forming means is a metal-based layer which forms a Schottky barrier with the body portion.

In this improved Schottky diode disclosed by B. M. Wilamowski the field-relief regions are in the form of a grid of regions in the body which are of opposite conductivity type and which form a p-n junction with the body portion. These regions, which are also contacted by the metal-based layer, act as a screen to lower the electrical field near the barrier at the surface during reverse bias of the barrier. As a result, the blocking capability is improved by a reduction of the reverse leakage current, a sharpening of the breakdown characteristic and an increase of the breakdown voltage, e.g. from 43 volts to 135 volts. When the Schottky barrier is forward biased the field-relief regions are considered to be inactive since the forward voltage drop on the Schottky barrier is smaller than the forward voltage drop would be on the p-n junction for the same current density.

It is necessary to enlarge the device area in order to accommodate both the field-relief regions and a given area for the Schottky barrier. This increases the junction parasitic capacitance, and so can reduce the switching speed of the device particularly at low voltages. However, experiments on minority carrier storage effects conducted by the present inventors indicate that a significant reduction in the switching speed of this previously-disclosed device can result from minority carrier injection into the body portion at the p-n junction when the device is forward biased. The present invention is based on the recognition that when operating at high current densities or with unipolar barriers having a high barrier this p-n junction must act as an efficient injector of minority carriers which will seriously degrade the frequency response to the overall structure.

SUMMARY OF THE INVENTION

According to the present invention there is provided a semiconductor device comprising a semiconductor body, a portion of which is of one conductivity type, unipolar barrier-forming means which forms an active barrier with said body portion at a plurality of separate areas, and closely-spaced field-relief regions which protrude to a depth in the body below the active barrier, the separate areas of the active barrier being located between the closely-spaced field-relief regions, the field-relief regions being sufficiently closely spaced that depletion layers extending in the body portion from neighboring field-relief regions merge together under reverse-bias of the active barrier to provide the device with an improved voltage blocking characteristic, characterised in that a layer of different material from that of the body portion and from that of the unipolar barrier-forming means is present at least at the area of the field-relief regions and provides the field-relief regions with means for restricting the flow of minority carriers into the body portion under forward-bias of the active barrier.

Such a structure may be used to restrict minority carrier flow from field-relief regions in Schottky diodes and in other devices with Schottky barriers or with other forms of unipolar barrier-forming means, for example so-called "camel" barriers as disclosed in U.S. Pat. No. 4,149,174.

Said layer of different material may be present in a groove in the body surface at the area of the field-relief regions and/or at a major surface of the body. It may form with the body portion a heterojunction which provides the means for restricting minority-carrier flow under forward-bias. However said layer of different material may instead or additionally form a high-impedence electrical connection which restricts the minority-carrier flow.

BRIEF DESCRIPTION OF THE DRAWING

Particular examples of these and other features in accordance with the present invention will now be described with reference to the accompanying diagrammatic drawings illustrating, by way of example, several different embodiments of the invention. In these drawings.

Figure 1:
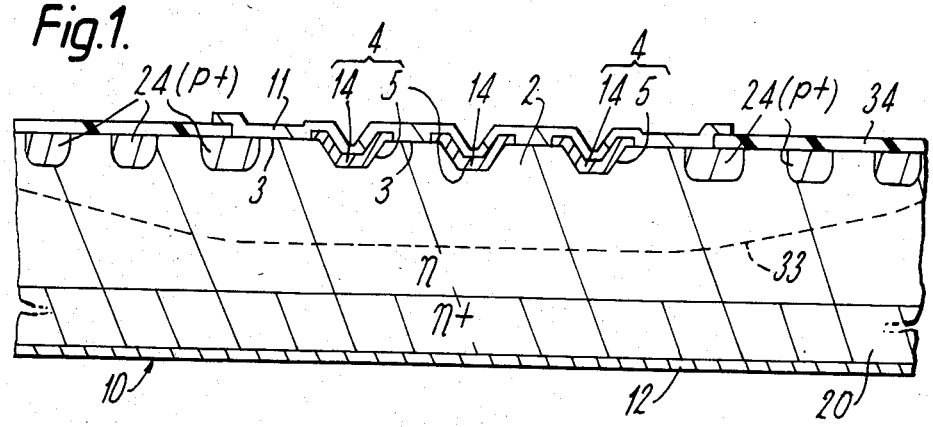
FIGS. 1 to 6 are cross-sectional views of different semiconductor devices in accordance with the invention.

It should be noted that all the Figures are diagrammatic and not drawn to scale. The relative dimensions and proportions of various parts of these Figures have been shown exaggerated or reduced for the sake of clarity and convenience in the drawing. Also for the sake of clarity in the drawing some of the thin regions of the devices are not hatched. The same reference signs as used in one Figure are also generally used to refer to corresponding or similar parts in the other embodiments.

DESCRIPTION OF THE PREFERRED EMBODIMENTS

The semiconductor device of FIG. 1 is a high voltage Schottky diode comprising a semiconductor body 10 of, for example, monocrystalline silicon, a portion 2 of which is of one conductivity type (n-type in the example shown). A metal-based layer 11 is present at the upper major surface of the body 10 and forms a Schottky barrier with the body portion 2 at a plurality of separate areas to constitute the active barrier 3 of the diode. The layer 11 may be of, for example, titanium. Closely spaced field-relief regions 4 protrude to a depth in the body 10 below the active barrier 3 and the separate areas of the active barrier 3 are located between the closely-spaced field-relief regions 4. In a particular embodiment of the diode of FIG. 1, the regions 4 may be in a concentric arrangement with, for example, a central region 4 and an annular surrounding region 4. The field-relief regions 4 are sufficiently closely spaced that depletion layers 33 extending in the body from neighboring regions 4 merge together under reverse-bias of the active barrier 3 to provide the device with a high voltage blocking characteristic.

In accordance with the present invention, the field-relief regions 4 in the example of FIG. 1 are provided by a metal-based layer 14 which forms with the body portion 2 a Schottky barrier having a higher barrier height than the active barrier 3. The layer 14 is of different material from that of the layer 11 and may be, for example, platinum silicide. Compared with a p-n junction, the Schottky barrier of the field-relief regions 4 in the example of FIG. 1 (being a heterojunction unipolar structure) is a very inefficient injector of minority carriers into the body portion 2 under forward-bias of the active barrier 3. Having a higher barrier height than the barrier 3 it will provide field relief without degrading the reverse characteristics.

A groove 5 is present in the upper major surface of the body 10 at the area of the field-relief regions 4, and the layer 14 contacts the body portion 2 at the walls of the groove 5.

The diode of FIG. 1 can be manufactured using known device technologies. Thus, for example, the body portion 2 may be formed by a high resistivity n-type epitaxial layer on a high conductivity n-type silicon substrate 20 which forms part of the connection to the body portion 2. The grooves 5 are etched into the surface of the epitaxial layer, and a contact window is defined in an insulating layer 34 of, for example, thermally-grown silicon dioxide at the surface of the epitaxial layer. Platinum or another suitable metal for forming a high Schottky barrier is then deposited in the grooves 5 to provide the field-relief regions 4, and titanium or another suitable metal for forming the active Schottky barrier 3 is then deposited over the contact window. This latter metal layer 11 also forms an electrical connection to the underlying metal regions 14 of the field-relief regions 4. An electrode layer 12 of, for example, aluminum is deposited on the back surface of the substrate 20.

As illustrated in FIG. 1, guard rings 24 may also be provided in the body portion 2 around the contact window. FIG. 1 illustrates three such concentric guard rings formed in known manner as p-type annular regions in the n-type portion 2. These p-type regions 24 can be formed by, for example, boron diffusion before etching the grooves 5.

Figure 2:
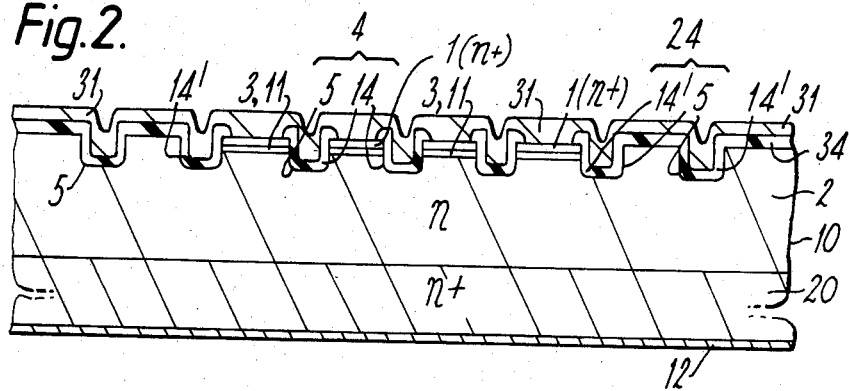

The field-relief regions 4 may be formed in various ways with different means for restricting minority carrier flow into the body portion 2 under forward bias of the active barrier 3. Thus, the layer 14 of material different from that of the body portion 2 and different from that of the unipolar barrier forming means 11 may be of dielectric material overlaid by an electrode to form the field-relief regions 4 as a capacitive field-effect structure. In such a modification of the FIG. 1 diode the overlying electrode may merely be the layer 11 which forms the Schottky barrier 3 with the body portion 2. In one specific example of such a modified Schottky diode, the dielectric layer 14 may be of silicon dioxide thermally grown on the walls of the grooves 5 and the layer 11 forming the Schottky barrier 3 may be of, for example, chromium. FIG. 2 illustrates a similar capacitance field-effect structure for the field-relief regions of another type of device having a different type of unipolar barrier forming means.

The device of FIG. 2 is a particular form of a so-called "bulk unipolar diode" in which the active barrier 3 is formed by a semiconductor barrier region 11 located between the body portion 2 and a highly-doped region 1 of the same conductivity type (n-type in the example) as the body portion 2. Both regions 1 and 3,11 are part of the semiconductor body 10. The barrier region 3,11 contains a net impurity concentration of the opposite conductivity type (p-type in the example) and is at least substantially fully depleted of free charge-carriers by depletion layers formed (as zero bias) with the region 1 and body portion 2. The barrier regions 3,11 may be formed in accordance with the teaching in U.S. Pat. No. 4,149,174. The region 1 is contacted by an electrode layer 31. In this embodiment, it is the electrode layer 31 which overlies the dielectric layer 14 at the area of the grooves 5 to form the field-relief regions 4. Furthermore, since the layer 14 is of insulating material the regions 1 and 2 may extend laterally to the field-relief regions 4 in this embodiment. When other forms of field-relief region are used with bulk unipolar diodes it may sometimes be desirable to localize the regions 1 and 3,11 inbetween the field-relief regions 4 so that the regions 1 and 3,11 are spaced from the field-relief regions 4 and terminate below an insulating layer at the upper major surface of the body 10.

FIG. 2 also illustrates another modification in which guard rings 24 extending around the contact window are formed simultaneously with the field-relief regions 4. Thus, FIG. 2 includes two such guard rings 24 comprising concentric annular grooves 5 whose walls are covered with a dielectric layer 14' overlaid by the electrode layer 31. By forming the guard rings 24 and field-relief regions 4 in the same process the total number of processing steps for the manufacture of the device can be reduced.

Figure 3:
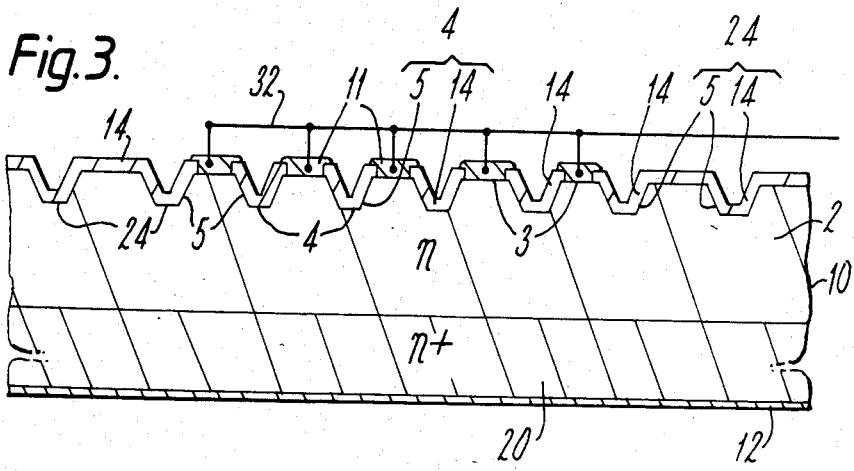

FIG. 3 illustrates another particularly simple modification in which the field-relief regions 4 and guard rings 24 are formed at the grooves 5 by a layer 14 of semi-insulating material (for example, a layer comprising a mixture of polycrystalline silicon and silicon oxide) which extends also over the upper major surface of the body 10. A heterojunction is present at the interface of the mixed oxide:silicon layer 14 and the silicon body portion 2, and forms depletion layers with the body portion 2 when the diode is reverse-biased. This heterojunction and the high impedance of the layer 14 restricts minority carrier injection when the diode is forward-biased. By way of example a Schottky diode is illustrated in FIG. 3, and the metal layer 11 which forms the active barrier 3 is illustrated as localized to the areas between the grooves 5 and does not overlie to any great extent the semi-insulating layer 14. The separate areas of the metal layer 11 may be connected together electrically by wires.

However, instead of semi-insulating material, the layer 14 may be of semiconductor material having a wider energy band gap than the semiconductor material of the body 10. Thus, for example the body substrate 20 and body portion 2 may be of n-type gallium arsenide whereas the layer 14 may be of high resistivity gallium aluminum arsenide which forms with the body portion 2 a heterojunction restricting the injection of minority carriers. In this particular example the Schottky metal layer 11 may be of, for example, aluminum.

Figure 4:
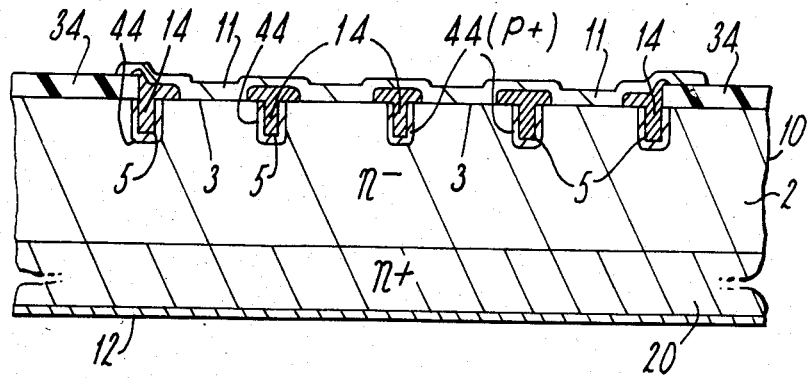
Figure 5:
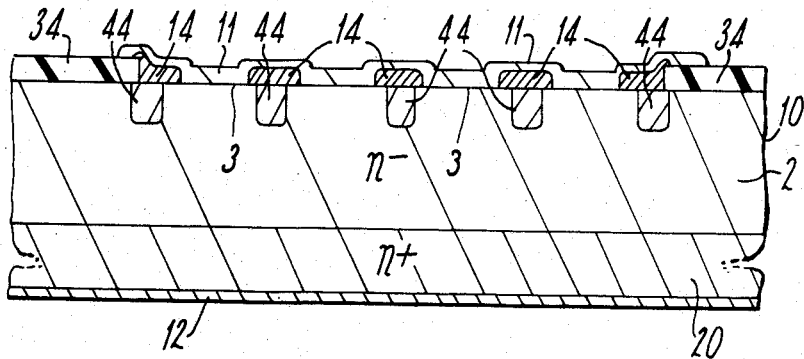

In the devices of FIGS. 1 to 3 the layer 14 of different material in the grooves 5 provides the field-relief regions 4 and forms a heterojunction with the body portion 2 at the walls of the grooves 5. This heterojunction has a higher barrier height than the active barrier 3 and provides the means restricting the flow of minority carriers into the body portion 2 under forward-bias of the active barrier 3. However, FIGS. 4 and 5 illustrate a different type of embodiment in which the field-relief regions 4 comprise regions 44 of opposite conductivity type (p-type in the example shown) provided in the body 10 and forming a p-n junction with the body portion 2. In these embodiments the layer 14 of different material may be of semi-insulating material (for example a layer comprising a mixture of polycrystalline silicon and silicon oxide) and provides a high-impedance path which forms part of the electrical connection between the regions 44 of the field-relief regions 4 and the unipolar barrier-forming means 11. This high-impedance electrical connection restricts the flow of minority carriers from these opposite conductivity type regions 44 into the body portion 2 under forward bias of the active barrier 3. In the particular form illustrated in FIG. 4, the regions 44 and layer 14 are provided at grooves 5 in the upper major surface of the body 10, whereas the particular form illustrated in FIG. 5 is of planar construction in which the regions 44 and layer 14 adjoin the upper major surface of the body 10.

Figure 6:
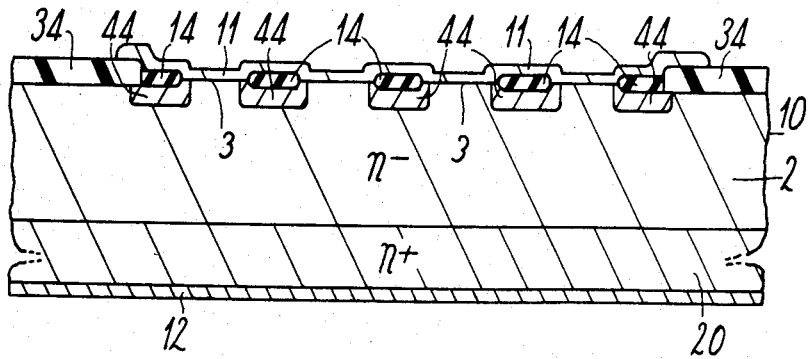

In the embodiments of FIGS. 4 and 5, the layer 14 of semi-insulating material prevents direct contact between the field-relief regions 44 and the electrode layer 11 forming a Schottky barrier with body portion 2, so as to form the high-impedance electrical connection which restricts the current flow between the electrode layer 11 and the regions 44. FIG. 6 illustrates another embodiment having a modified arrangement for restricting the current flow. In this embodiment the layer 14 is of insulating material located over a central area of each p-type field-relief region 44 to restrict the contact area with the Schottky electrode layer 11 to a peripheral portion of each region 44. This arrangement can be formed in a particularly reliable manner when the layer 14 is of silicon dioxide formed by local oxidation so as to be at least partly sunk in the regions 44. The oxidation can be localized using a mask pattern of silicon nitride as described in UK Patent GB-A 1 208 574. Depending on whether any etching step is performed (either before or inbetween oxidation) the oxide layer 14 may be partly or wholly sunk in the body 10 as described in GB-A 1 208 574.

An advantage of using such a local oxidation treatment is that the central areas of the regions 44 can be automatically aligned with the layer pattern 14 by using the windows in the masking pattern for the silicon nitride oxidation mask as dopant windows for locally introducing boron or other dopant for the regions 44 into the epitaxial body portion 2 before at least the final oxidation step, as described in GB-A 1 208 574. The dopant for the region 44 diffuses during the subsequent oxidation step to form the peripheral portion of the region 44 extending in a reliably controllable manner around the layer pattern 14. Therefore, as compared with the central area, this peripheral portion has a lower conductivity type determining doping concentration which is diffused from the central area and which thus provides a reproduceable high impedance for the connection to the layer 11. It is also possible to make the insulating layer 14 sufficiently wide with respect to the regions 44 to prevent current flow directly between electrode layer 11 and the regions 44, which are then at a floating potential dependent of the depletion layer from the reverse-biased barrier 3.

It will be evident that other modifications are possible within the scope of the invention. Thus, for example, a planar construction may even be used for shallower but closer spaced heterojunction field-relief regions 4 (without requiring the grooves 5 of FIG. 1) since the depth to which the layer 14 is sunk in the body portion 2 of FIG. 1 during silicide formation can be controlled with appropriately thick platinum deposits. Instead of a concentric annular configuration for the field-relief regions 4 and active barrier areas 3, other geometries, for example a mesh or grid arrangement or polygonal array, may be employed.

We claim:

1. A semiconductor device comprising a semiconductor body having a body portion of one conductivity type, unipolar barrier-forming means for forming an active barrier with said body portion at a plurality of separate areas, and closely-spaced surface-adjacent field-relief regions which protrude to a depth in the body below the active barrier, the separate areas of the active barrier being located between the closely-spaced field-relief regions, and the field-relief regions being sufficiently closely spaced such that depletion layers extending in the body portion from neighboring field-relief regions merge together under reverse-bias of the active barrier to provide the device with an improved voltage blocking characteristic, and said field-relief regions comprising layer means of a different material from that of the body portion and from that of the unipolar barrier-forming means provided at least in the area of the field-relief regions for enabling the field-relief regions to restrict the flow of minority carriers into the body portion under forward-bias of the active barrier, said layer means comprising a material selected from the group consisting of a dielectric material, a semi-insulating material, and a metal-based material.

2. A device as claimed in claim 1, further characterized in that a groove is provided in said surface of the body at each of said area of the field-relief regions, and said layer means of a different material is provided in the groove.

3. A device as claimed in claim 2, further characterized in that said layer means of a different material in the groove comprises the field-relief regions and forms a heterojunction with the body portion at the walls of each groove, said heterojunction restricting said flow of minority carriers under forward-bias of the active barrier.

4. A device as claimed in claim 3, further characterized in that said layer means of a different material is a metal-based layer which forms with the body portion a Schottky barrier having a higher barrier height than the active barrier.

5. A device as claimed in claim 3, further characterized in that said layer of different material is of dielectric material and is overlaid by an electrode to form the field-relief regions as a capacitive field-effect structure.

6. A device as claimed in claim 3, further characterized in that said layer of different material is of semi-insulating material.

7. A device as claimed in claim 1 or 2, further comprising an electrode layer, wherein said field-relief regions comprise regions of a second, opposite conductivity type formed in said body portion and in electrical connection with said electrode layer, and further characterized in that said layer means of a different material is located between the electrode layer and the field-relief regions to restrict current flow between the electrode layer and the field-relief regions to restrict the flow of minority carriers from these opposite conductivity type regions into the body portion under forward bias of the active barrier.

8. A device as claimed in claim 7, further characterized in that said layer means of a different material is of semi-insulating material and forms between the electrode layer and the field-relief regions a high-impedance electrical connection which restricts the current flow between the electrode layer and the field-relief regions.

9. A device as claimed in claim 7, further characterized in that said layer means of a different material is of insulating material located over a central area of each field-relief region of said opposite conductivity type so that the electrode layer contacts a peripheral portion of each field-relief region and thereby restricts the current flow between the electrode layer and the field-relief regions.

10. A device as claimed in claim 9, in which said body portion is of silicon, and further characterized in that said layer of different material is means of a silicon dioxide formed by local oxidation so as to be at least partly sunk into the field-relief regions, and in that the peripheral portion of each field-relief region, has a lower conductivity type determining doping concentration than that of said central area.

11. A device as claimed in claim 1 or 2, further characterized in that the unipolar barrier-forming means comprises a semiconductor barrier region which contains a net impurity concentration of the opposite conductivity type and which is located between said body portion and a further semiconductor region of said one conductivity type, said barrier region being at least substantially fully depleted of free charge carriers by depletion layers formed at zero bias with the body portion and further region.

12. A device as claimed in claim 1 or 2, wherein the unipolar barrier-forming means comprises a metal-based layer which is present at a surface of the body and which forms a Schottky barrier with said body portion.

* * * * *